United States Patent
Li et al.

(10) Patent No.: US 10,367,008 B2
(45) Date of Patent: Jul. 30, 2019

(54) ARRAY SUBSTRATE, DISPLAY PANEL AND DISPLAY DEVICE

(71) Applicant: BOE TECHNOLOGY GROUP CO., LTD., Beijing (CN)

(72) Inventors: Hui Li, Beijing (CN); Yun Sik Im, Beijing (CN); Hyun Sic Choi, Beijing (CN); Kuanjun Peng, Beijing (CN); Yu'e Jia, Beijing (CN); Hui Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 35 days.

(21) Appl. No.: 15/521,016

(22) PCT Filed: Oct. 24, 2016

(86) PCT No.: PCT/CN2016/102992
§ 371 (c)(1),
(2) Date: Apr. 21, 2017

(87) PCT Pub. No.: WO2017/113950
PCT Pub. Date: Jul. 6, 2017

(65) Prior Publication Data
US 2018/0083038 A1 Mar. 22, 2018

(30) Foreign Application Priority Data
Dec. 31, 2015 (CN) .......................... 2015 1 1032316

(51) Int. Cl.
*H01L 27/12* (2006.01)
*H01L 27/14* (2006.01)
(Continued)

(52) U.S. Cl.
CPC ...... *H01L 27/124* (2013.01); *G02F 1/134309* (2013.01); *G02F 1/136286* (2013.01); *G02F 2001/134372* (2013.01)

(58) Field of Classification Search
CPC ............ H01L 27/124; H01L 27/14603; H01L 27/14609; H01L 27/14812; H01L 27/326; G02F 1/136286; G02F 1/1343
See application file for complete search history.

(56) References Cited

U.S. PATENT DOCUMENTS

| 6,300,926 | B1 | 10/2001 | Yoneya |
| 2011/0069263 | A1 | 3/2011 | Takeda |
| 2017/0287944 | A1* | 10/2017 | Jiang .................. H01L 27/1218 |

FOREIGN PATENT DOCUMENTS

| CN | 1567066 A | 1/2005 |
| CN | 102629061 A | 8/2012 |

(Continued)

OTHER PUBLICATIONS

International Search Report dated Dec. 26, 2016.
(Continued)

*Primary Examiner* — Thanhha S Pham
(74) *Attorney, Agent, or Firm* — Dilworth & Barrese, LLP.; Michael J. Musella, Esq.

(57) ABSTRACT

An array substrate, a display panel and a display device are provided. The array substrate includes a base substrate, and, subpixels disposed on the base substrate. A first electrode and a second electrode are disposed in each of the subpixels; the first electrode includes first electrode strips; the second electrode includes second electrode strips. A distance between a projection of one second electrode strip and a projection of a first electrode strip adjacent to the second electrode strip in the first direction is S1; a distance between the projection of the second electrode strip and a projection of one first electrode strip adjacent to the second electrode
(Continued)

strip in a direction opposite to the first direction is S2; a first domain includes a part in which S1 is greater than S2; and a second domain includes a part in which S1 is less than S2.

17 Claims, 11 Drawing Sheets

(51) Int. Cl.
*G02F 1/136* (2006.01)
*G02F 1/13* (2006.01)
*G02F 1/1362* (2006.01)
*G02F 1/1343* (2006.01)

(56) References Cited

FOREIGN PATENT DOCUMENTS

| | | |
|---|---|---|
| CN | 102749765 A | 10/2012 |
| CN | 202383394 U | 1/2014 |
| CN | 104516160 A | 4/2015 |
| CN | 105487307 A | 4/2016 |
| CN | 205263445 U | 5/2016 |
| CN | 106129065 A | 11/2016 |
| JP | 2003057670 A | 2/2003 |

OTHER PUBLICATIONS

First Chinese office action dated Jul. 28, 2016.
Second Chinese Office action dated Oct. 24, 2016.
Third Chinese Office Action dated Jan. 25, 2017.

* cited by examiner

ARRAY SUBSTRATE, DISPLAY PANEL AND DISPLAY DEVICE

TECHNICAL FIELD

At least one embodiment of the present invention relates to an array substrate, a display panel and a display device.

BACKGROUND

With the development of liquid crystal display (LCD) technology, thin-film transistor liquid crystal displays (TFT-LCDs) are widely applied in various fields. In the TFT-LCD, the light intensity is controlled by the control of the deflection of liquid crystal molecules, and then color image display is achieved by the filter action of a color filter (CF) layer.

In general, TFT-LCDs and other electronic products have a multi-layer structure. In the manufacturing process, each layer for forming the multi-layer structure is usually formed by deposition process or sputtering process; photoresist is formed on each layer; the photoresist is patterned via a mask; and subsequently, a patterned layer is obtained after etching by taking the patterned photoresist as a mask. Semiconductor devices have process bias due to the difference in the pattern size and the pattern density of various layers of the semiconductor devices on a base substrate.

The TFT-LCDs include in-plane switching (IPS) mode and advanced-super dimensional switching (ADS) mode. In the IPS mode and the ADS mode, multi-dimensional electric fields are formed by parallel electric fields produced at edges of pixel electrodes or common electrodes and vertical electric fields produced between the pixel electrodes and the common electrodes, so that liquid crystal molecules in all the alignments in a liquid crystal cell, between the pixel electrodes and the common electrodes or over the pixel electrodes or the common electrodes, can rotate.

SUMMARY

At least one embodiment of the invention provides an array substrate, a display panel and a display device. The array substrate has high tolerance in process bias such as CD bias and overlay margin and can also maintain good uniformity of display brightness by improve the pixel electrode and the common electrode of the liquid crystal mode and their arrangement.

At least one embodiment of the invention provides an array substrate, comprising a base substrate, and a plurality of gate lines, a plurality of data lines and a plurality of subpixels disposed on the base substrate, wherein a first electrode and a second electrode insulated from each other are disposed in each of the subpixels; the first electrode includes a plurality of first electrode strips; the second electrode includes a plurality of second electrode strips; the plurality of first electrode strips are electrically connected with each other; the plurality of second electrode strips are electrically connected with each other; in projections of the plurality of first electrode strips and the plurality of second electrode strips on the base substrate, a distance along a direction parallel to a first direction between a projection of one second electrode strip and a projection of a first electrode strip adjacent to the second electrode strip in the first direction is S1; a distance along the direction parallel to the first direction between the projection of the second electrode strip and a projection of one first electrode strip adjacent to the second electrode strip in a direction opposite to the first direction is S2; the plurality of subpixels include a first domain and a second domain; the first domain and the second domain are disposed in the same subpixel or disposed in different subpixels; the first domain includes a part in which S1 is greater than S2; and the second domain includes a part in which S1 is less than S2.

For example, in the array substrate provided by one embodiment of the invention, the first direction is along one extension direction of the data lines, or the first direction is along one extension direction of the gate lines.

For example, in the array substrate provided by one embodiment of the invention, the first electrode strips and the second electrode strips in the first domain have a same extension direction; the first electrode strips and the second electrode strips in the second domain have a same extension direction; and the electrode strips in the first domain and the second domain have a same extension direction or different extension directions.

For example, in the array substrate provided by one embodiment of the invention, an angle between the extension direction of the electrode strips of the first domain and the extension direction of the electrode strips of the second domain is greater than 0° and less than or equal to 90°.

For example, in the array substrate provided by one embodiment of the invention, the first domain further includes a part in which S1 is less than S2, and the second domain further includes a part in which S1 is greater than S2.

For example, in the array substrate provided by one embodiment of the invention, the first domain and the second domain are disposed in the same subpixel; and the subpixel further includes a third domain in mirror symmetry with the first domain and a fourth domain in mirror symmetry with the second domain.

For example, in the array substrate provided by one embodiment of the invention, the first domain and the second domain are disposed in different subpixels; the first domain is disposed in a first subpixel; the second domain is disposed in a second subpixel; and the array substrate further comprises a third subpixel in mirror symmetry with the first subpixel and a fourth subpixel in mirror symmetry with the second subpixel.

For example, in the array substrate provided by one embodiment of the invention, in the first domain and the second domain, the area of the part in which S1 is greater than S2 is equal to the area of the part in which S1 is less than S2.

For example, in the array substrate provided by one embodiment of the invention, $0.03 \leq |S1-S2|/|S1+S2| \leq 0.3$.

For example, in the array substrate provided by one embodiment of the invention, $0.4\ \mu m \leq |S1-S2| \leq 0.6\ \mu m$.

For example, in the array substrate provided by one embodiment of the invention, the first electrode is a common electrode, and the second electrode is a pixel electrode; or the first electrode is a pixel electrode, and the second electrode is a common electrode.

For example, in the array substrate provided by one embodiment of the invention, the first electrode and the second electrode are arranged in different layers or a same layer.

For example, in the array substrate provided by one embodiment of the invention, both the first electrode and the second electrode are transparent conductive electrodes.

For example, in the array substrate provided by one embodiment of the invention, projections of the plurality of second electrode strips on the base substrate and projections of the plurality of first electrode strips on the base substrate are alternately arranged.

At least one embodiment of the invention provides a display panel, comprising any array substrate as mentioned above.

At least one embodiment of the invention provides a display device, comprising the display panel as mentioned above.

BRIEF DESCRIPTION OF THE DRAWINGS

Simple description will be given below to the accompanying drawings of the embodiments to provide a more clear understanding of the technical proposals of the embodiments of the present invention. Obviously, the drawings described below only involve some embodiments of the present invention but are not intended to limit the present invention.

FIG. 1b is a schematic diagram of an area indicated by a dashed box A in FIG. 1a;

Figure 1A:
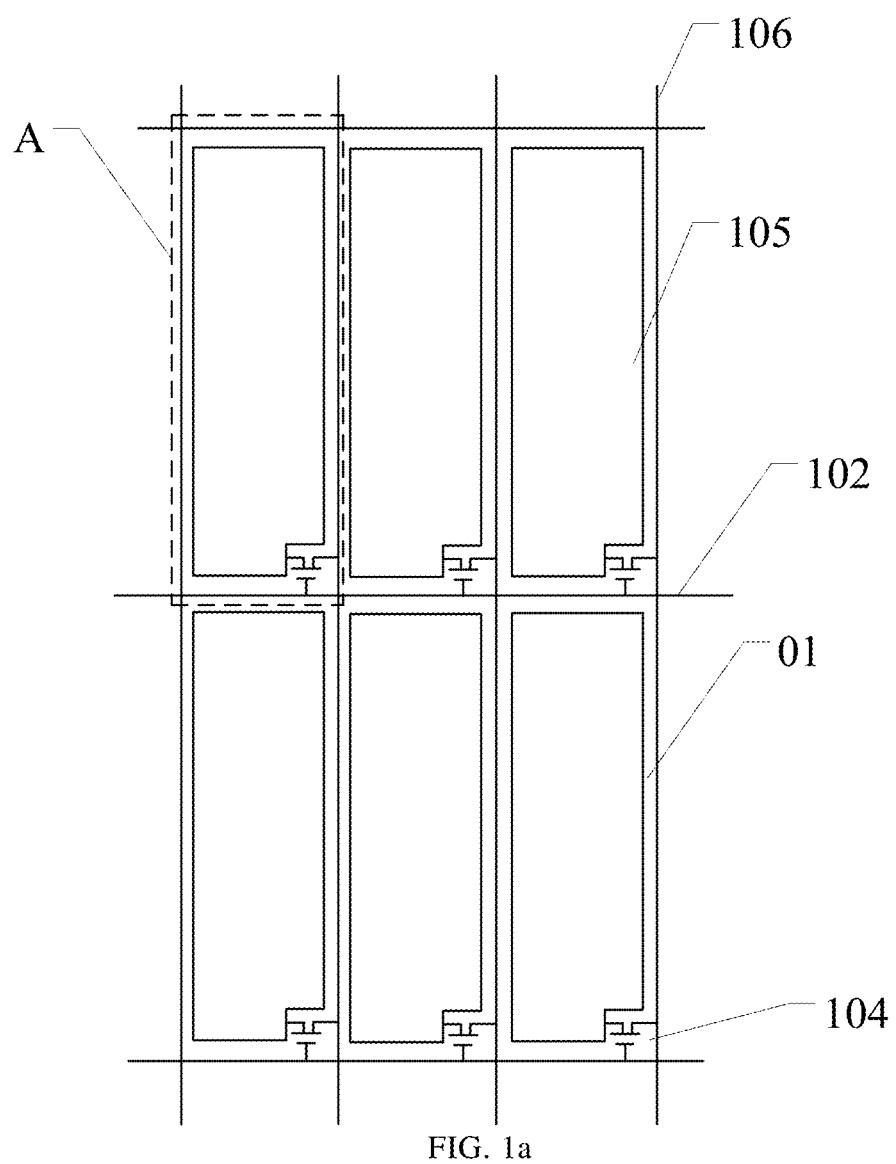
FIG. 1a is a schematic plane view of an array substrate.

Reference numerals of the accompanying drawings:
101—base substrate; 102—gate line; 103—through hole; 104—thin-film transistor (TFT); 1041—gate electrode; 1042—gate insulating layer; 1043—active layer (semiconductor layer); 1044—drain electrode; 1045—source electrode; 105—pixel electrode; 1050—pixel electrode strip; 106—data line; 107—first electrode; 1070—first electrode strip; 108—second electrode; 1080—second electrode strip; 109—common electrode; 1090—common electrode strip; 1101—first domain; 1102—second domain; 1103—third domain; 1104—fourth domain; 01—subpixel; 011—first subpixel; 012—second subpixel; 013—third subpixel; 014—fourth subpixel; 131—first insulating layer; 132—second insulating layer; 010—a part in which S1 is greater than S2; 020—a part in which S1 is less than S2.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise specified, the technical terms or scientific terms used in the disclosure have normal meanings understood by those skilled in the art. The words "first", "second" and the like used in the disclosure do not indicate the sequence, the number or the importance but are only used for distinguishing different components. Similarly, the words "a", "an", "the" and the like also do not indicate the number but only indicate at least one. The word "comprise", "include" or the like only indicates that an element or a component before the word contains elements or components listed after the word and equivalents thereof, not excluding other elements or components. The words "connection", "connected" and the like are not limited to physical or mechanical connection but may include electrical connection, either directly or indirectly. The words "on", "beneath", "left", "right" and the like only indicate the relative position relationship which is correspondingly changed when the absolute position of a described object is changed.

For example, in the IPS mode and the ADS mode, pixel electrodes and/or common electrodes may include a plurality of electrode strips. The plurality of electrode strips mainly require the control of the CD bias and the overlay margin of a mask. As the process bias of the pixel electrodes and/or the common electrodes will result in different transmittances of pixels, the brightness of the entire panel can be nonuniform.

FIG. 1a is a schematic plan view of an array substrate, and the array substrate comprises a plurality of gate lines 102 and a plurality of data lines 106. For example, the plurality of gate lines 102 are parallel to each other and extended along the transverse direction; the plurality of data lines 106 are parallel to each other and extended along the longitudinal direction; the plurality of gate lines 102 and the plurality of data lines 106 are intersected with each other; and the transverse direction and the longitudinal direction are perpendicular to each other.

For example, the plurality of gate lines 102 and the plurality of data lines 106 are insulated from each other; and an insulating layer may be disposed between a layer provided with the plurality of gate lines 102 and a layer provided with the plurality of data lines 106.

For example, as illustrated in FIG. 1a, the plurality of gate lines 102 and the plurality of data lines 106 are intersected with each other to define a plurality of subpixels 01; one pixel electrode 105 is disposed in each subpixel 01; the on and off of the pixel electrode 105 is controlled by a switching element; and the switching element is, for example, a TFT 104.

It should be noted that the subpixels 01 may be defined by the plurality of gate lines 102 and the plurality of data lines 106, but the embodiment is not limited thereto. One subpixel 01, for example, includes one gate line, one data line, one pixel electrode and one switching element. The subpixel 01 is the minimum unit for display in the array substrate.

Figure 1B:
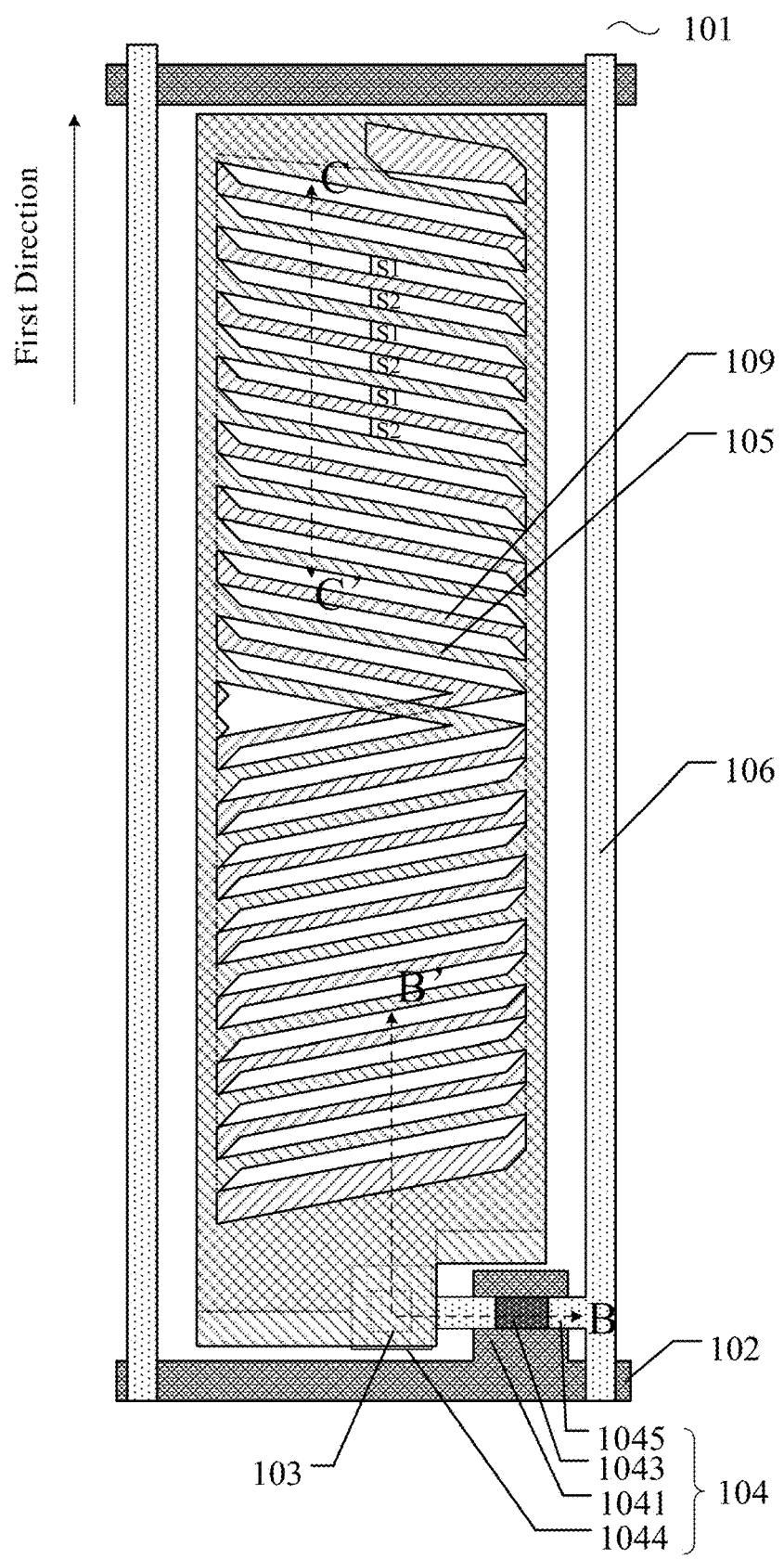

FIG. 1b is a schematic top view as illustrated by a dashed box A in FIG. 1a. As illustrated in FIG. 1b, the array substrate comprises a base substrate 101, gate lines 102 and data lines 106 intersected with each other and disposed on the base substrate 101, TFTs 104 disposed on the base substrate 101 and driven by the gate lines 102, and pixel electrodes 105 and common electrodes 109 disposed in areas defined by the gate lines 102 and the data lines 106. The TFT 104 includes a gate electrode 1041, an active layer (semiconductor layer) 1043, a drain electrode 1044 and a source electrode 1045; the data line 106 is electrically connected with the source electrode 1045; and the pixel electrode 105 is electrically connected with the drain electrode 1044. For example, both the pixel electrodes 105 and the common electrodes 109 may be slit electrodes, and the pixel electrodes 105 are disposed above a layer provided with the common electrodes 109. Each of the pixel electrodes 105 includes a plurality of electrode strips 1050 (please refer to FIGS. 1b and 1d), and each of the common electrodes 109 includes a plurality of electrode strips 1090 (please refer to FIGS. 1b and 1d). For example, in the same domain, projections of a plurality of pixel electrode strips 1050 on the base substrate 101 and projections of a plurality of common electrode strips 1090 on the base substrate 101 are alternately arranged. In the projections of the plurality of pixel electrode strips 1050 and the plurality of common electrode strips 1090 on the base substrate 101, the distance along a direction parallel to a first direction between a projection of one pixel electrode strip 1050 and a projection of a common electrode strip 1090 adjacent to the pixel electrode strip in the first direction is S1; and the distance along the direction parallel to the first direction between the projection of the pixel electrode strip 1050 and a projection of a common electrode strip 1090 adjacent to the pixel electrode strip in a direction opposite to the first direction (in the opposite direction of the first direction) is S2. For example, the first direction is along one extension direction of the data lines. As illustrated in FIG. 1b, the data lines 106 are extended along two directions, and the first direction is one extension direction of the two extension directions of the data lines. An angle between the other extension direction of the data lines and the first direction is 180°.

Figure 1C:
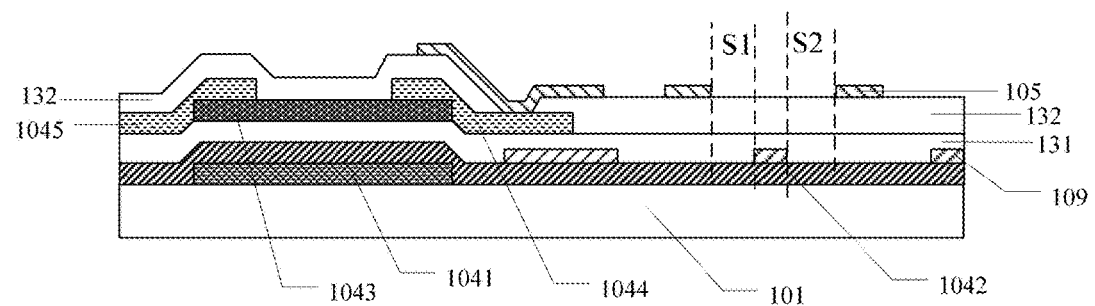
FIG. 1c is a schematic sectional view along the B-B' direction in FIG. 1b.

FIG. 1c is a schematic sectional view along the B-B' direction in FIG. 1b. FIG. 1c illustrates a gate insulating layer 1042, a first insulating layer 131 and a second insulating layer 132. For example, the material of the gate insulating layer 1042, the first insulating layer 131 and the second insulating layer 132 includes one or more selected from silicon nitride (SiNx), silicon oxide (SiOx) and silicon oxynitride (SiNxOy), but the embodiment is not limited thereto. In FIG. 1c, the pixel electrodes 105 and the common electrodes 109 are arranged in different layers. In the present invention, the pixel electrodes 105 and the common electrodes 109 may also be arranged in the same layer. No limitation will be given here.

Figure 1D:
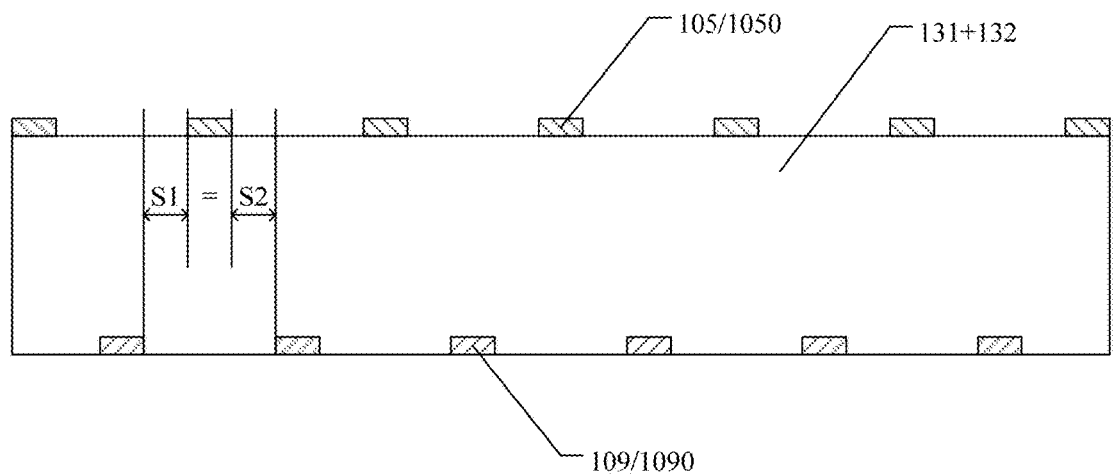
FIG. 1d is a schematic sectional view along the C-C' direction in FIG. 1b.

FIG. 1d is a schematic sectional view along the C-C' direction in FIG. 1b. As illustrated in FIG. 1d, S1 and S2 are generally set to be equal. The case of S1=S2 may be recorded as case 1. Due to the defects such as CD bias and shift bias of the mask produced in the manufacturing process, in the actually manufactured array substrate, S1≠S2, the electric fields formed between the pixel electrodes 105 and the common electrodes 109 can be nonuniform, so that the brightness of the entire display panel can be nonuniform.

At least one embodiment of the present invention provides an array substrate, a display panel and a display device. The array substrate comprises a base substrate, and a plurality of gate lines, a plurality of data lines and a plurality of subpixels disposed on the base substrate.

A first electrode and a second electrode insulated from each other are disposed in each of the subpixels; the first electrode includes a plurality of first electrode strips; the second electrode includes a plurality of second electrode strips; the plurality of first electrode strips are electrically connected with each other; and the plurality of second electrode strips are electrically connected with each other.

In projections of the plurality of first electrode strips and the plurality of second electrode strips on the base substrate, the distance between a projection of one second electrode strip and a projection of a first electrode strip adjacent to the second electrode strip in a first direction, along a direction parallel to the first direction, is S1; the distance between the projection of the second electrode strip and a projection of a first electrode strip adjacent to the second electrode strip in a direction opposite to the first direction, along the direction parallel to the first direction, is S2; and the first direction is along one extension direction of the data lines, or the first direction is along one extension direction of the gate lines.

The plurality of subpixels include first domains and second domains; the first domain and the second domain are disposed in the same subpixel or disposed in different subpixels; the first domain includes a part in which S1 is greater than S2; and the second domain includes a part in which S1 is less than S2.

In the array substrate, due to the design of the first electrodes and the second electrodes (the pixel electrodes and the common electrodes) and the arrangement mode thereof, in the case of process bias, due to the compensation of the light transmittance of the first domains and the second domains, light running through different areas in adjacent subpixels or one subpixel can achieve uniform light intensity by mutual compensation, so that the light transmittance of the subpixels of the entire display panel employing the array substrate can be uniform, and hence the product quality and the image quality can be improved.

Description will be given below with reference to several embodiments. Description will be given below in the embodiments by taking the case that the first direction is along one extension direction of the data lines as an example. The first direction may also be along one extension direction of the gate lines. No limitation will be given here. When the first direction is along one extension direction of the gate lines, the tilt direction of the domains in the embodiments may be required to rotate for 90° clockwise or counterclockwise.

First Embodiment

Figure 2:
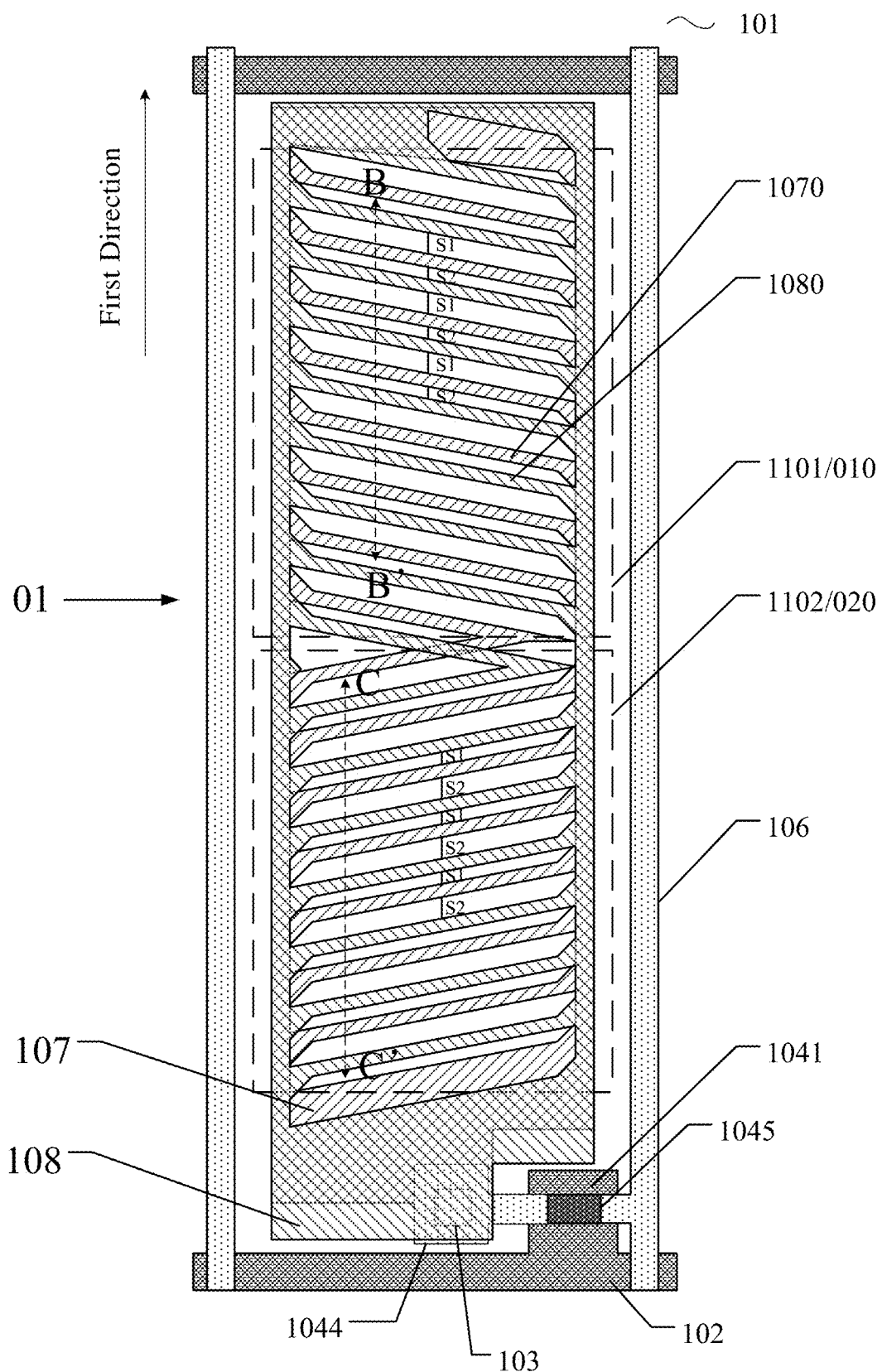
FIG. 2 is a schematic plan view of an array substrate provided by the first embodiment of the present invention.

The embodiment provides an array substrate. As illustrated in FIG. 2, the array substrate comprises a base substrate 101, and a plurality of gate lines 102, a plurality of data lines 106 and a plurality of subpixels 01 disposed on the base substrate 101.

A first electrode 107 and a second electrode 108 insulated from each other are disposed in the subpixel 01; the first electrode 107 includes a plurality of first electrode strips 1070; the second electrode 108 includes a plurality of second electrode strips 1080; the plurality of first electrode strips 1070 are electrically connected with each other; and the plurality of second electrode strips 1080 are electrically connected with each other.

In projections of the plurality of first electrode strips 1070 and the plurality of second electrode strips 1080 on the base substrate 101, the distance between a projection of one second electrode strip 1080 and a projection of a first electrode strip 1070 adjacent to the second electrode strip in a first direction, along a direction parallel to the first direction, is S1; the distance between the projection of the second electrode strip 1080 and a projection of a first electrode strip 1070 adjacent to the second electrode strip in a direction opposite to the first direction, along the direction parallel to the first direction, is S2; and the first direction is along one extension direction of the data lines 106.

For example, S1 refers to the length of a projection of a slit (gap) between one second electrode strip and a first electrode strip adjacent to the second electrode strip in the first direction on the base substrate in the direction parallel to the first direction. For example, S2 refers to the length of a projection of a slit (gap) between the second electrode strip and a first electrode strip adjacent to the second electrode strip in the direction opposite to the first direction on the base substrate in the direction parallel to the first direction.

The subpixel 01 includes a first domain 1101 and a second domain 1102; the first domain 1101 and the second domain 1102 are disposed in the same subpixel 01; the first domain 1101 includes a part 010 in which S1 is greater than S2; and the second domain 1102 includes a part 020 in which S1 is less than S2. The case of S1>S2 may be recorded as case 2, and the case of S1<S2 may be recorded as case 3.

For example, in the same domain, projections of the plurality of second electrode strips 1080 on the base substrate 101 and projections of the plurality of first electrode strips 1070 on the base substrate 101 are alternately arranged.

It should be noted that the sequence of the part in which S1 is less than S2 and the part in which S1 is greater than S2 as illustrated in the figure shall not be construed as the limitation of the present invention, and may be set according to actual demands.

Figure 3:
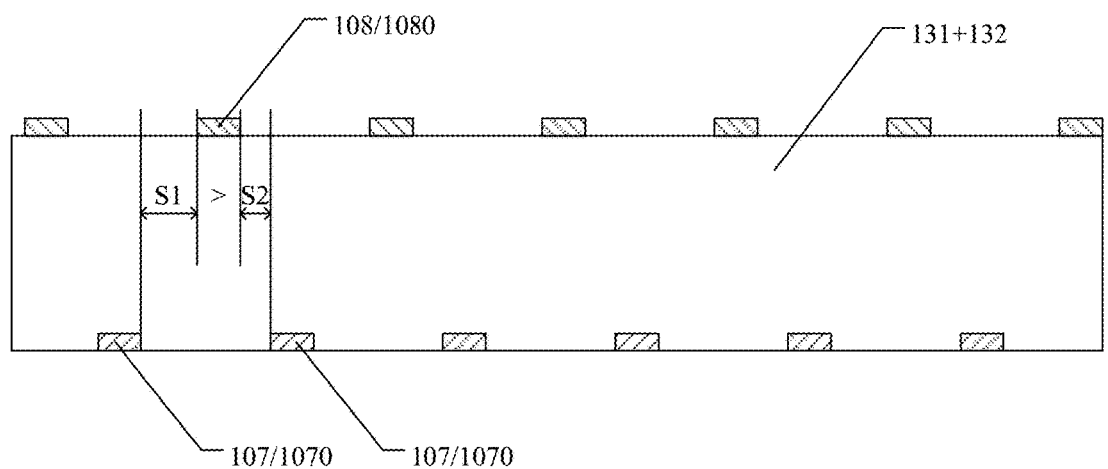
FIG. 3 is a schematic sectional view along the B-B' direction in FIG. 2.
Figure 4:
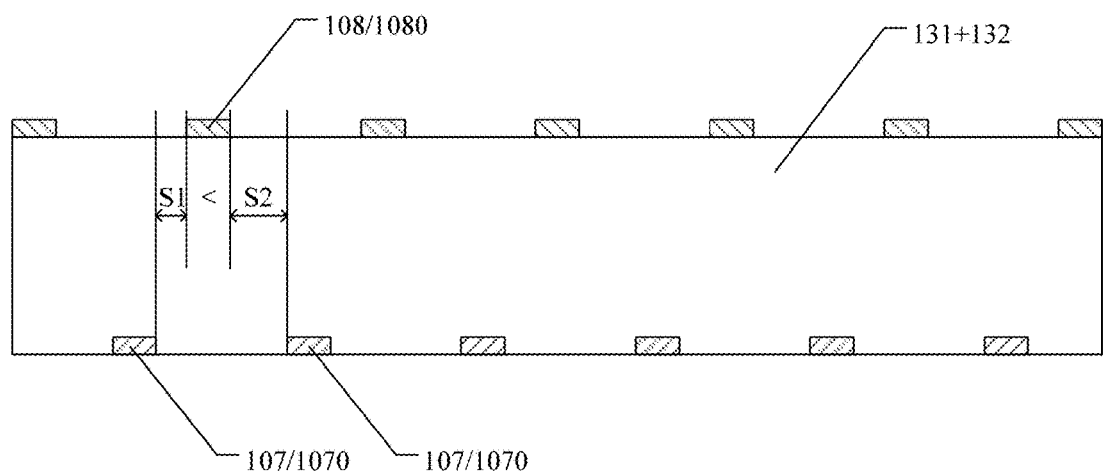
FIG. 4 is a schematic sectional view along the C-C' direction in FIG. 2.

FIGS. 3 and 4 are respectively a sectional view along the B-B' direction and a sectional view along the C-C' in FIG. 2, namely FIGS. 3 and 4 respectively correspond to the case 2 and the case 3.

Figure 5:
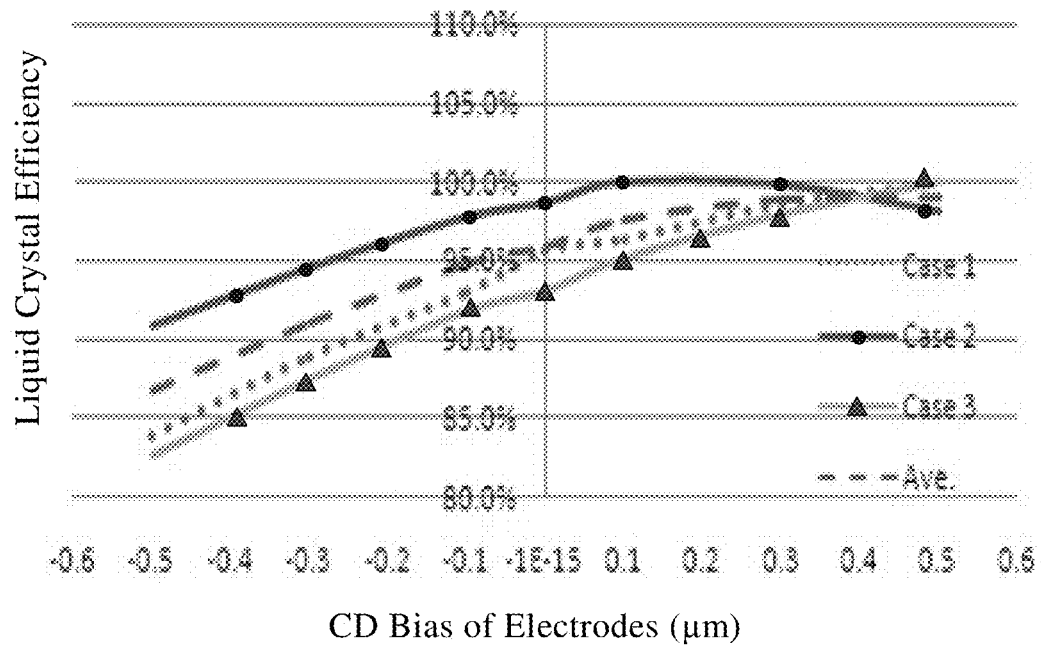
FIG. 5 is a schematic diagram illustrating the relation between the CD bias of electrodes and the liquid crystal efficiency in the array substrate provided by the first embodiment of the present invention.

FIG. 5 is a diagram illustrating the relation between the CD bias of electrodes and the liquid crystal efficiency when the CD bias is within ±0.5 μm. As illustrated in FIG. 5, the case 1 is a relation curve between the CD bias of the electrodes and the liquid crystal efficiency in the case of S1=S2 in the conventional technology. The case 2 is a relation curve between the CD bias of the electrodes and the liquid crystal efficiency in the case of S1>S2. The case 3 is a relation curve between the CD bias of the electrodes and the liquid crystal efficiency in the case of S1<S2. A relation average curve (Ave.) between the CD bias of the electrodes and the liquid crystal efficiency is obtained by the superposition of the curves of the case 2 and the case 3. It is easy to find that the slope of the average curve (Ave.) when the CD bias is within ±0.5 μm is lower than the slope of the curve of the case 1. It indicates that the variation of the overall liquid crystal efficiency of the array substrate is less than that of the conventional technology. That is to say, when the CD bias is within ±0.5 μm, the variation of the overall light transmittance of the array substrate is less than that of the conventional technology, so the uniformity of light transmittance is obviously improved.

Figure 6:
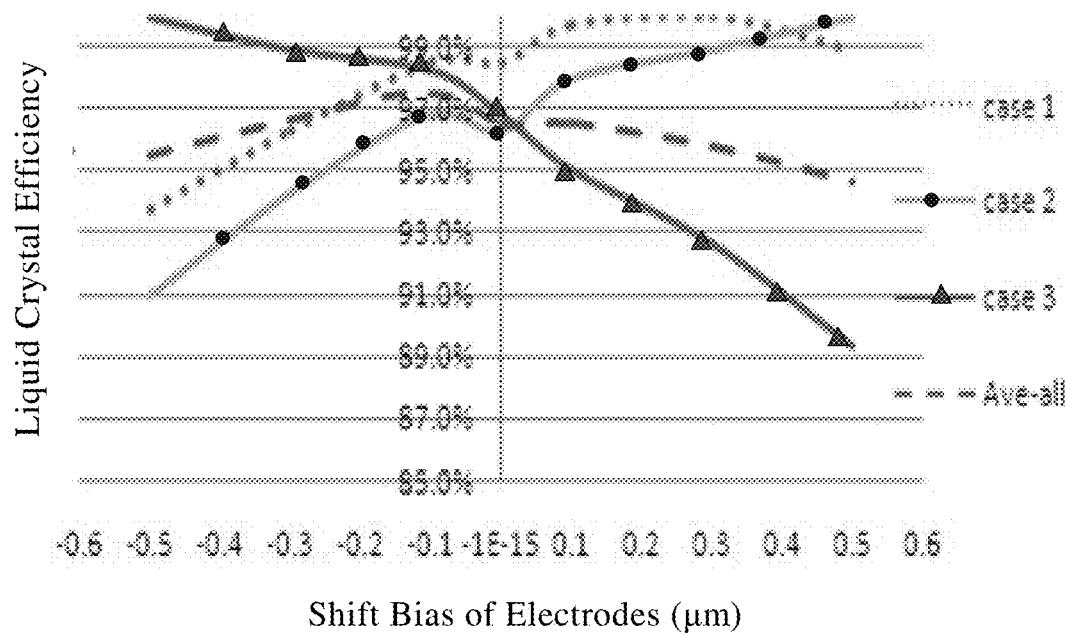
FIG. 6 is a schematic diagram illustrating the relation between the shift bias of the electrodes and the liquid crystal efficiency in the array substrate provided by the first embodiment of the present invention.

FIG. 6 is a diagram illustrating the relation between the shift bias of the electrodes and the liquid crystal efficiency when the shift bias of the electrodes is within ±0.5 μm. As illustrated in FIG. 6, the case 1 is a relation curve of the shift bias of the electrodes and the liquid crystal efficiency in the case of S1=S2 in the conventional technology; the case 2 is a relation curve of the shift bias of the electrodes and the liquid crystal efficiency in the case of S1>S2; the case 3 is a relation curve of the shift bias of the electrodes and the liquid crystal efficiency in the case of S1<S2; and a relation average curve (Ave-all) of the shift bias of the electrodes and the liquid crystal efficiency is obtained by the superposition of the curves of the case 2 and the case 3. It is easy to find that the slope of the average curve (Ave-all) when the CD bias is within ±0.5 μm is lower than the slope of the curve of the case 1. That is to say, when the shift bias of the electrodes is within ±0.5 μm, the variation of the overall liquid crystal efficiency of the array substrate is less than that of the conventional technology, and the variation is also about 95%. That is to say, on the premise of not obviously reducing the transmittance, the variation of the overall light transmittance of the array substrate is less than that of the conventional technology, so the uniformity of light transmittance is also obviously improved.

In the array substrate provided by the embodiment, the subpixel 01 includes a first domain 1101 and a second domain 1102; the first domain 1101 includes a part 010 in which S1 is greater than S2; and the second domain 1102 includes a part 020 in which S1 is less than S2. In the first domain 1101, S1 is greater than S2; in the second domain 1102, S1 is less than S2; S1 and S2 in the first domain 1101 and the second domain 1102 are designed to be different; the first domain includes the part in which S1 is greater than S2; and the second domain includes the part in which S1 is less than S2. Due to the influence of process bias such as CD bias and shift bias of the electrodes in the actual manufacturing process, |S1-S2| in one of the first domain 1101 and the second domain 1102 will be increased and |S1-S2| in the other one will be reduced, so that the transmittance of one of the first domain 1101 and the second domain 1102 will be increased and the transmittance of the other one will be reduced. With reference to FIGS. 5 and 6, light running through the first domain 1101 and the second domain 1102 may compensate each other by superposition, so that the finally obtained light transmittance of the entire subpixel 01 can have good uniformity within a certain range of bias, and hence the light transmittance of the display panel comprising the array substrate can have good uniformity within a certain range of bias, and consequently the product quality can be improved.

In the array substrate provided by the embodiment, the same subpixel 01 includes the first domain and the second domain, and the compensation action of the light transmittance is performed in each subpixel. Thus, the array substrate provided by the embodiment can provide uniform light transmittance no matter used for displaying which color or gray scale. Moreover, as can be known from FIGS. 5 and 6, the array substrate provided by the embodiment has high tolerance in process bias such as CD bias and overlay margin, and can also maintain good uniformity among different batches of products.

For example, in one example of the embodiment, the first electrode strip and the second electrode strip in the first domain have same extension direction; the first electrode strip and the second electrode strip in the second domain have same extension direction; and the electrode strips in the first domain and the second domain may have the same direction or different extension directions. Description is given in FIG. 2 by taking the case that the electrode strips in the first domain and the second domain have different extension directions as an example. The array substrate provided by the embodiment can achieve the effect of inhibiting gray-scale inversion and color shift by arranging domains, in which the extension directions of electrode strips are different, in one subpixel, and hence further improve the product quality.

For example, in one example of the embodiment, an angle between the extension direction of the electrode strips of the first domain and the extension direction of the electrode strips of the second domain is greater than or equal to 0° and less than or equal to 90° (0-90°). For example, as the electrode strips are extended towards two directions, the angle between the extension direction of the electrode strips of the first domain and the extension direction of the electrode strips of the second domain is all greater than or equal to 0° and less than or equal to 90°. For example, when the extension direction of the electrode strips of the first domain is the same with the extension direction of one of the data line or the gate line, the angle between the extension direction of the electrode strips of the second domain and the extension direction of the electrode strips of the first domain may be greater than or equal to 0° and less than 90°. For example, when the extension direction of the electrode strips of the first domain is different from the extension direction of the data line and the gate line, the angle between the extension direction of the electrode strips of the second domain and the extension direction of the electrode strips of the first domain may be greater than or equal to 0° and less than or equal to 90°. In some examples, the angle may be greater than 0° and less than 90° or ranged from 0° to 60°, 0° to 45°, or 0° to 30°. In this way, the first domain and the second domain may have compensation effect, so that the uniformity of light transmittance can be improved.

For example, in one example of the embodiment, the first domain may also include a part in which S1 is less than S2, the second domain may also include a part in which S1 is greater than S2. No limitation will be given here in the embodiment of the present invention. In this way, high uniformity of light transmittance is achieved by the compensation effect inside the domains in each subpixel unit, and subsequently, gray-scale inversion and color shift are inhibited by the complementary action of different domains, so that the product quality can be further improved.

Figure 7:
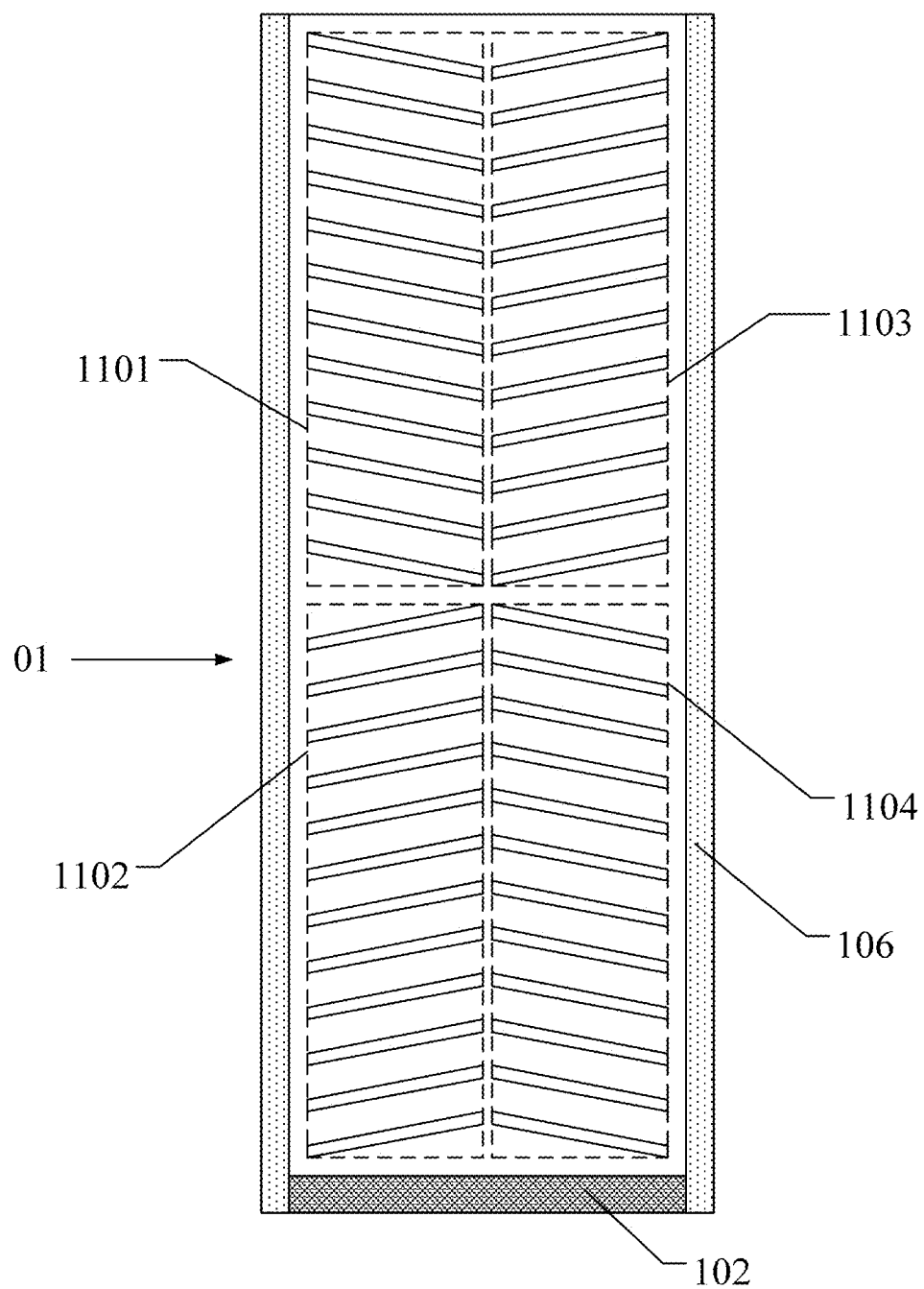
FIG. 7 is a schematic plan view of another array substrate provided by the first embodiment of the present invention.

For example, in one example of the embodiment, the first domain 1101 and the second domain 1102 are disposed in the same subpixel. As illustrated in FIG. 7, the subpixel may also include a third domain 1103 in mirror symmetry with the first domain 1101 and a fourth domain 1104 in mirror symmetry with the second domain 1102. In the array substrate provided by the example, two domains, of which the angle between the extension directions of the electrode strips is greater than 0° and less than 90°, and the other two domains, which are respectively in mirror symmetry with the two domains, are arranged in the same subpixel. The asterisk (*)-shaped domain structure in the same subpixel can achieve the effect of inhibiting gray-scale inversion and color shift and further improve the product quality, so that the compensation effect of light in the same subpixel can be enhanced. For example, in the subpixel 01 as illustrated in FIG. 7, the angle between the extension direction of the electrode strips of the first domain 1101 and the extension direction of the electrode strips of the second domain 1102 is greater than 0° and less than 90°.

For example, the base substrate 101 may be a glass substrate, a quartz substrate or other substrates.

For example, the material of the gate lines 102 and/or the data lines 106 includes one or more selected from the group consisted of aluminum, aluminum alloy, copper, copper alloy, molybdenum and molybdenum-aluminum alloy.

For example, the TFT 104 may be an oxide TFT, an amorphous silicon (a-Si) TFT, a polycrystalline silicon (poly-Si) TFT, etc.

For example, the area of the part in which S1 is greater than S2 in the first domain 1101 is equal to the area of the part in which S1 is less than S2 in the second domain 1102. For example, in the entire array substrate, the sum of the area of the parts in which S1 is greater than S2 is equal to the sum of the area of the parts in which S1 is less than S2. It should be noted that: when the sum of the area of the parts in which S1 is greater than S2 is equal to the sum of the area of the parts in which S1 is less than S2, the relation curve of the CD bias of the electrodes and the liquid crystal efficiency and/or the relation curve of the shift bias of the electrodes and the liquid crystal efficiency of the case 2 and the case 3 may be uniformly superposed, so that mutual compensation effect can be better and higher uniformity of light transmittance can be achieved.

For example, the relation of S1 and S2 satisfies the following relational expression: $0.03 \leq |S1-S2|/|S1+S2| \leq 0.3$ (the ratio of an absolute value of the difference of S1 and S2 to the sum of S1 and S2 is greater than or equal to 0.03 and less than or equal to 0.3).

When $|S1-S2|/|S1+S2|$ is less than 0.03, the compensation effect of the first domain 1101 and the second domain 1102 is reduced and close to that of the case 1; and when $|S1-S2|/|S1+S2|$ is greater than 0.3, due to process bias, the superposition problem of the first electrode 107 and the second electrode 108 tend to occur. For example, when the width of the first electrode strip 1070 is 2.1±0.3 μm, the width of the second electrode strip 1080 being 3.1±0.5 μm, S1 being 1.2±0.3 μm, better compensation effect can be achieved by the control of $0.03 \leq |S1-S2|/|S1+S2| \leq 0.3$.

For example, in the array substrate provided by the embodiment, when the width of the first electrode strip 1070 is 2.1±0.3 μm, the width of the second electrode strip 1080 being 3.1±0.5 μm, S1 being 1.2±0.3 μm, $0.4 \ \mu m \leq |S1-S2| \leq 0.6 \ \mu m$.

For example, the first electrode 107 is a common electrode and the second electrode 108 is a pixel electrode; or the first electrode 107 is a pixel electrode and the second electrode 108 is a common electrode.

For example, the second electrodes 108 are disposed above the first electrodes 107. But the setting modes of the first electrodes and the second electrodes are not limited thereto. The first electrodes 107 and the second electrodes 108 may be arranged in the same layer or different layers, and the plurality of first electrode strips 1070 and the plurality of second electrode strips 1080 are insulated from each other.

For example, both the first electrodes 107 and the second electrodes 108 are transparent conductive electrodes, e.g., ITO electrodes, but the embodiment is not limited thereto. For example, the first electrodes 107 and/or the second electrodes 108 may also be set to be opaque conductive electrodes according to actual demands. No limitation will be given here in the embodiment of the present invention.

Second Embodiment

Figure 8:
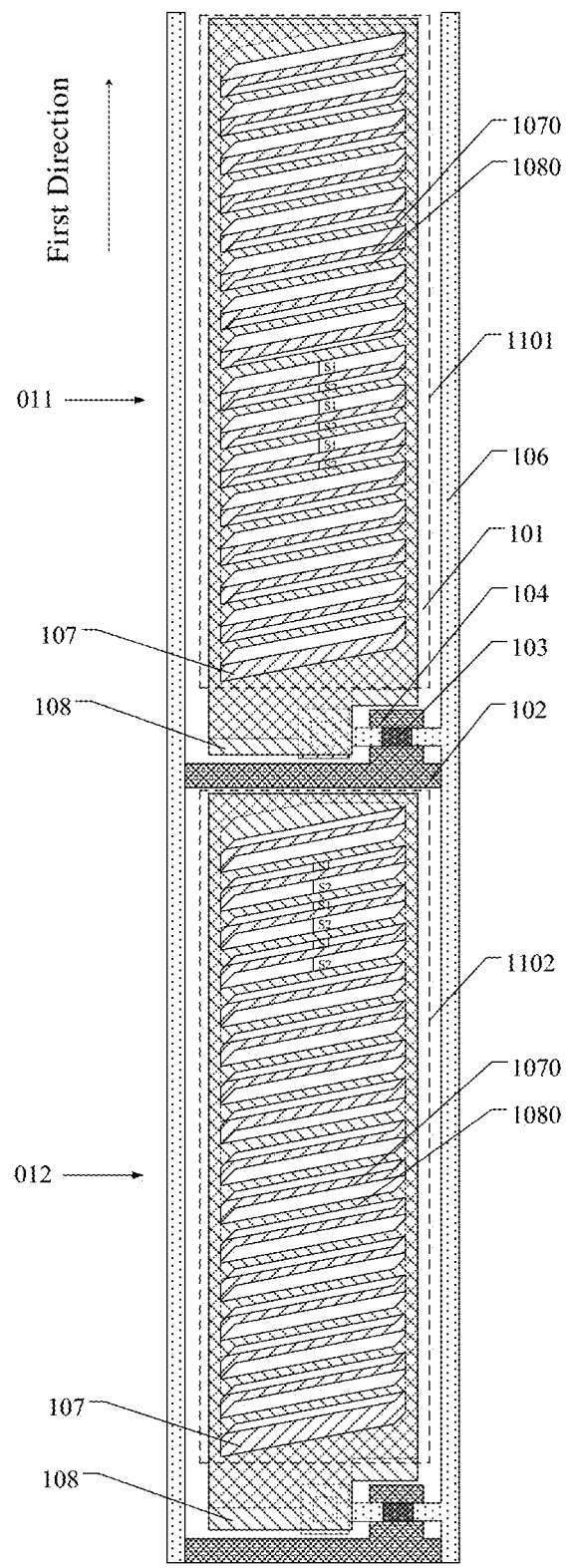
FIG. 8 is a schematic plan view of an array substrate provided by the second embodiment of the present invention.

In the embodiment, the difference with the first embodiment is that a first domain 1101 and a second domain 1102 are disposed in different subpixels. As illustrated in FIG. 8, the first domain 1101 is disposed in a first subpixel 011, and the second domain 1102 is disposed in a second subpixel 012.

Figure 9:
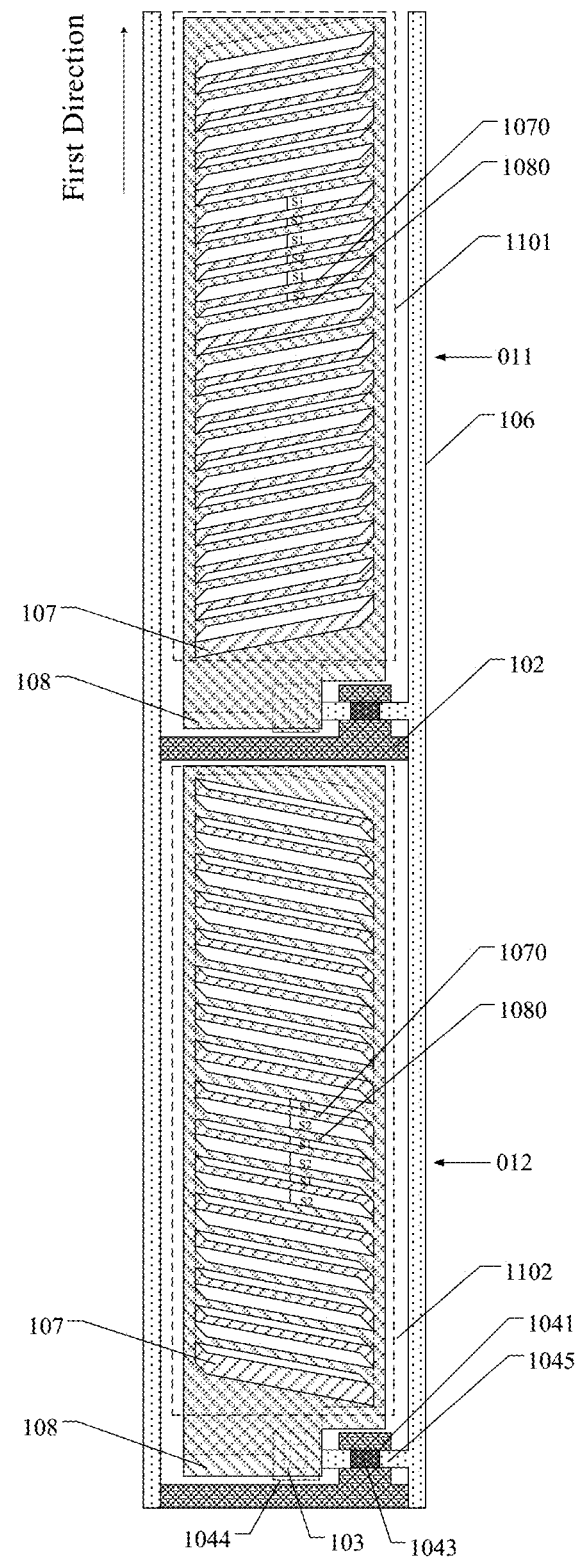
FIG. 9 is a schematic plan view of another array substrate provided by the second embodiment of the present invention.

For example, as illustrated in FIG. 8, the tilt direction of the first domain 1101 in the first subpixel 011 and the second domain 1102 in the second subpixel 012 may be the same, but the embodiment is not limited thereto. For example, as illustrated in FIG. 9, the tilt direction of the first domain 1101 in the first subpixel 011 and the second domain 1102 in the second subpixel 012 may also be different. An angle of the tilt directions (the extension direction of electrode strips) of the first domain 1101 in the first subpixel 011 and the second domain 1102 in the second subpixel 012, as illustrated in FIG. 9, is greater than 0° and less than 90°.

In the array substrate provided by the embodiment, when the CD bias is within ±0.5 μm, the variation of the overall light transmittance of the array substrate is also less than that of the prior art, so the uniformity of light transmittance is also obviously improved.

In the array substrate provided by the embodiment, when the shift bias of the electrodes is within ±0.5 μm, the variation of the liquid crystal efficiency of the array substrate is also less than that of the conventional technology, and the variation is also about 95%. That is to say, on the premise of not obviously reducing the transmittance, the variation of the overall light transmittance of the array substrate is less than that of the conventional technology, so the uniformity of light transmittance is obviously improved.

In the array substrate provided by the embodiment, S1 and S1 in the first subpixel 011 and the second subpixel 012 are designed to be different; the first domain in the first subpixel 011 includes a part in which S1 is greater than S2; and the second domain in the second subpixel 012 includes a part in which S1 is less than S2. Due to the influence of process bias such as CD bias and shift bias in the actual manufacturing process, |S1−S2| in one of the first subpixel 011 and the second subpixel 012 will be increased and |S1−S2| in the other one will be reduced, so that the light transmittance of one of the first subpixel 011 and the second subpixel 012 will be increased and the light transmittance of the other one will be reduced. With reference to FIGS. 6 and 6, light running through the first subpixel 011 and the second subpixel 012 may compensate each other by superposition, so that the finally obtained light transmittance of the entire first subpixel 011 and the entire second subpixel 012 within a certain range of bias can have good uniformity, and hence the product quality can be improved.

It should be noted that: in the embodiment, when the first subpixel 011 and the second subpixel 012 are used for displaying the same color and the same gray scale, the mutual compensation effect can be good and high uniformity of light transmittance can be obtained.

Figure 10:
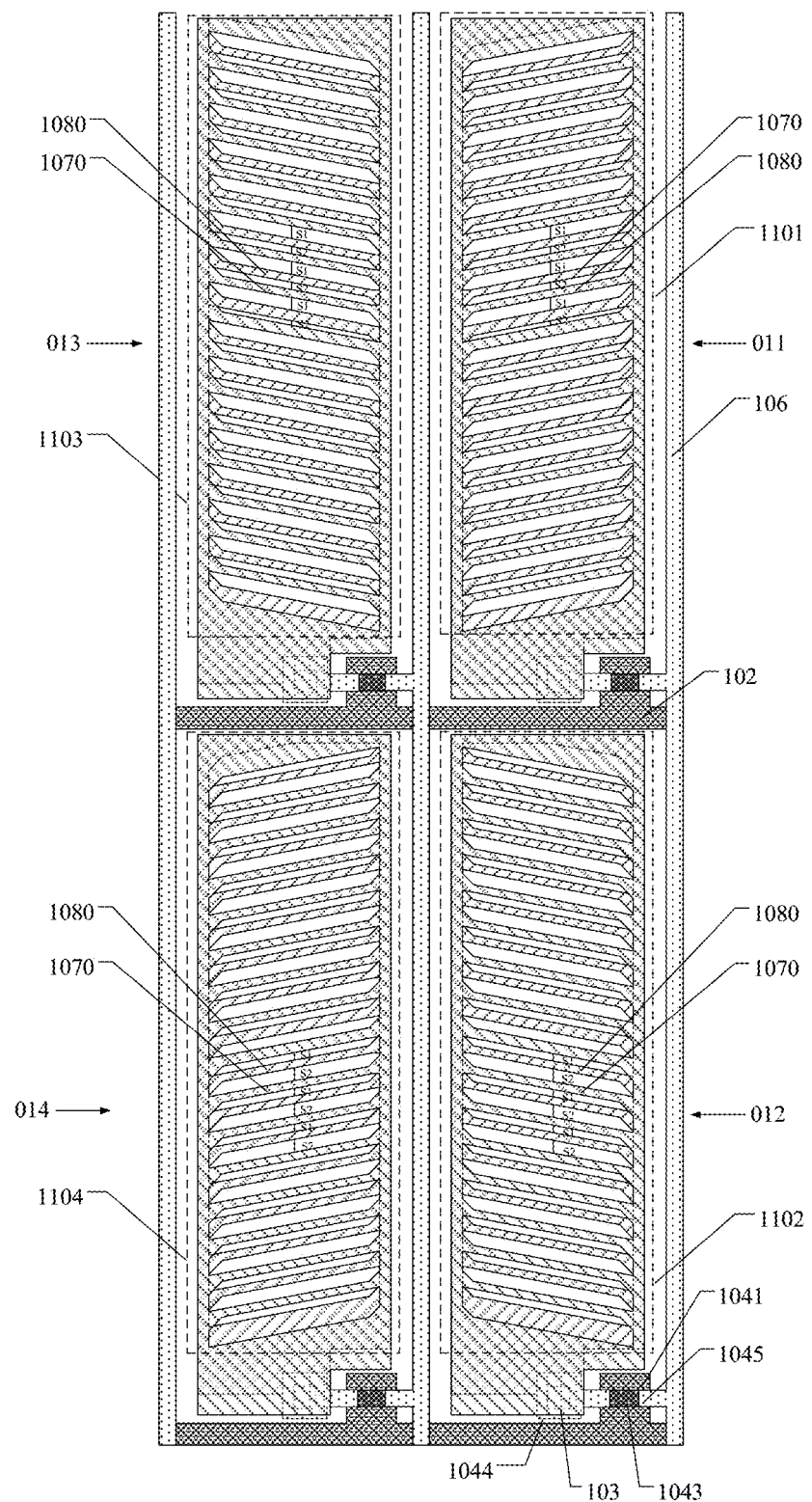
FIG. 10 is a schematic plan view of still another array substrate provided by the second embodiment of the present invention.

In one example of the embodiment, on the basis of the array substrate as illustrated in FIG. 9, the array substrate further comprises third subpixels 013 in mirror symmetry with the first subpixels 011 and fourth subpixels 014 in mirror symmetry with the second subpixels 012, as illustrated in FIG. 10. In the array substrate provided by the example, four domains with different extension directions of electrode strips are disposed in four adjacent subpixels (the four adjacent subpixels may include two domains with the same extension direction of electrode strips; no limitation will be given here), so that the effect of inhibiting gray-scale inversion and color shift can be achieved, and hence the product quality can be further improved.

It should be noted that description is given in the embodiments of the present invention by taking the case that the first insulating layer 131 and the second insulating layer 132 are disposed between the first electrodes 107 and the second electrodes 108 as an example, but the present invention is not limited thereto. For example, only one insulating layer may be disposed between the first electrodes 107 and the second electrodes 108.

Figure 11:
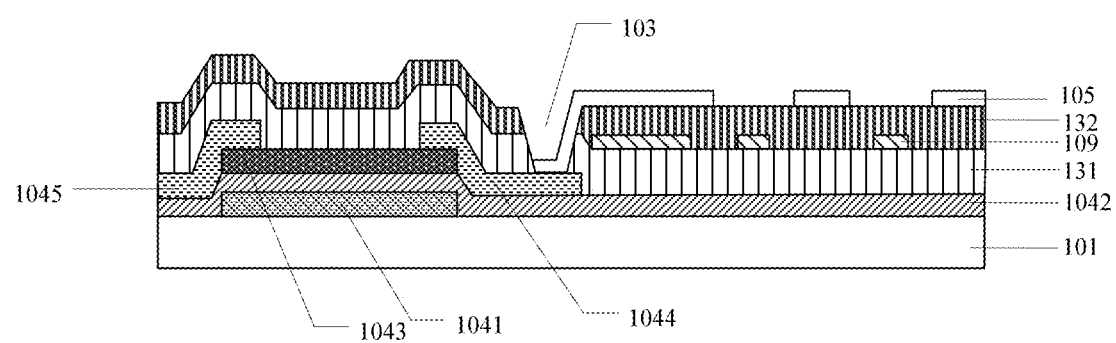
FIG. 11 is a schematic sectional view of an array substrate.

Moreover, the sectional view of the array substrate applicable to the embodiments is not limited to that illustrated in FIG. 1c. FIG. 1c only gives illustrative description for better understanding of the overall structure of the array substrate and is not intended to limit the present invention. For example, on the basis of the sectional view in FIG. 1c, the first insulating layer 131 may also be not arranged; drain electrodes 1044 and the common electrodes 109 are not overlapped (projections on the base substrate are not superimposed); and only one insulating layer is disposed between the common electrodes 109 and the pixel electrodes 105. For example, an organic insulating layer may further be arranged. When the organic insulating layer is arranged, the sectional view of the array substrate may be as illustrated in FIG. 11. In FIG. 11, the reference numeral of the accompanying drawing 131 may represent the organic insulating layer. The material of the organic insulating layer, for example, includes resin. For example, the material of the organic insulating layer includes acrylic resin or polyimide resin.

For example, the array substrate in the first embodiment and the second embodiment may be manufactured by the following method, but the present invention is not limited thereto.

S1: forming patterns of gate electrodes and gate lines on a base substrate, in which the gate electrodes are electrically connected with the gate lines. For example, a gate metal film may be formed on the base substrate, and the patterns of the gate electrodes and the gate lines may be formed by patterning process.

S2: forming a gate insulating layer, and forming patterns of common electrodes on the gate insulating layer. For example, a transparent conductive film may be formed on the gate insulating layer, and the patterns of the common electrodes may be formed by patterning process.

S3: forming a first insulating layer on the patterns of the common electrodes.

S4: forming patterns of active layers, source electrodes, drain electrodes and data lines on the first insulating layer. For example, a semiconductor film may be formed, and the patterns of the active layers may be formed by patterning process; and subsequently, a source/drain electrode film may be formed, and the patterns of the source electrodes, the drain electrodes and the data lines may be formed by patterning process. The data lines are electrically connected with the source electrodes.

S5: forming a second insulating layer and insulating layer through holes, and forming patterns of pixel electrodes on the second insulating layer. For example, the pixel electrodes are electrically connected with the drain electrodes via the insulating layer through holes.

It should be noted that: in the embodiment of the present invention, patterning or patterning process may only include photolithography process, or include photolithography process and etching process, or may include other processes for forming specified patterns such as printing and inkjet. The photolithography process refers to the forming of patterns by utilization of photoresist, a mask, an exposure machine and the like by technological processes such as film forming, exposure and development. Corresponding patterning processes may be selected according to the structures formed in the embodiment of the present invention.

For example, as illustrated in FIGS. 2-3 and FIGS. 8-10, the distance between two adjacent first electrode strips 1070 is equal. For example, as illustrated in FIGS. 2-3 and FIGS. 8-10, the distance between two adjacent second electrode strips 1080 is equal.

For example, as illustrated in FIGS. 2-3 and FIGS. 8-10, the width of the plurality of first electrode strips 1070 is the same. For example, as illustrated in FIGS. 2-3 and FIGS. 8-10, the width of the plurality of second electrode strips 1080 is the same.

For example, as illustrated in FIGS. 2-3 and FIGS. 8-10, the width of the first electrode strips 1070 is the same with the width of the second electrode strips 1080.

The width of the first electrode strip 1070, for example, refers to the length perpendicular to the extension direction of the first electrode strip 1070, and the width of the second electrode strip 1080, for example, refers to the length perpendicular to the extension direction of the second electrode strip 1080.

For example, the distance between two adjacent electrode strips being equal and the same width of the electrode strips may be favorable for the improvement of the uniformity of light transmittance.

Third Embodiment

The embodiment provides a display panel, which comprises any foregoing array substrate.

As the display panel comprises any foregoing array substrate, the display panel can also achieve uniform display brightness. Thus, the light transmittance of the display panel can be uniform, and hence the product quality and the image quality can be improved.

Fourth Embodiment

The embodiment provides a display device, which comprises the foregoing display panel.

The display device may be any product or component with display function such as an LCD and e-paper and a TV, a digital camera, a mobile phone, a watch, a tablet PC, a notebook computer and a navigator including the devices.

It should be noted that: for clarity, all the structures of the display panel and the display device are not given. In order to achieve the necessary functions of the display device, other structures not illustrated may be arranged by those skilled in the art according to specific application scenes. No limitation will be given here in the embodiment of the present invention. The technical effects of the display device provided by the embodiment refer to the technical effects of the display panel provided by the third embodiment. No further description will be given here.

The following points should be noted:

(1) Unless otherwise specified, the technical terms or scientific terms used in the disclosure shall have normal meanings understood by those skilled in the art. The words "first", "second" and the like used in the disclosure do not indicate the sequence, the number or the importance but are only used for distinguishing different components.

(2) Only the structures relevant to the embodiments of the present invention are involved in the accompanying drawings of the embodiments of the present invention, and other structures may refer to the prior art.

(3) For clarity, the thickness of layers or areas in the accompanying drawings of the embodiments of the present invention is enlarged. It should be understood that when an element such as a layer, a film, an area or a substrate is referred to be disposed "on" or "beneath" another element, the element may be "directly" disposed "on" or "beneath" another element, or an intermediate element may be provided.

(4) The projection in various embodiment of the invention may be, for example, orthogonal projection.

(5) The embodiments of the present invention and the characteristics in the embodiments may be mutually combined without conflict.

The foregoing is only the preferred embodiments of the present invention and not intended to limit the scope of protection of the present invention. Any change or replacement that may be easily thought of by those skilled in the art within the technical scope disclosed by the present invention shall fall within the scope of protection of the present invention. Therefore, the scope of protection of the present invention shall be defined by the appended claims.

The application claims priority to the Chinese patent application No. 201511032316.X, filed Dec. 31, 2015, the disclosure of which is incorporated herein by reference as part of the application.

The invention claimed is:

1. An array substrate, comprising a base substrate, and a plurality of gate lines, a plurality of data lines and a plurality of subpixels disposed on the base substrate, wherein a first electrode and a second electrode insulated from each other are disposed in each of the subpixels; the first electrode includes a plurality of first electrode strips; the second electrode includes a plurality of second electrode strips; the plurality of first electrode strips are electrically connected with each other; the plurality of second electrode strips are electrically connected with each other;

in projections of the plurality of first electrode strips and the plurality of second electrode strips on the base substrate, a distance along a direction parallel to a first direction between a projection of one second electrode strip and a projection of a first electrode strip adjacent to the second electrode strip in the first direction is S1; a distance along the direction parallel to the first direction between the projection of the one second electrode strip and a projection of one first electrode strip adjacent to the one second electrode strip in a direction opposite to the first direction is S2;

the plurality of subpixels include a first domain and a second domain; the first domain and the second domain are disposed in the same subpixel or disposed in different subpixels; the first domain includes a part in which S1 is greater than S2; and the second domain includes a part in which S1 is less than S2 wherein $0.03 \leq |S1-S2|/|S1-S2| \leq 0.3$.

2. The array substrate according to claim 1, wherein the first direction is along one extension direction of the data lines, or the first direction is along one extension direction of the gate lines.

3. The array substrate according to claim 1, wherein the first electrode strips and the second electrode strips in the first domain have a same extension direction; the first electrode strips and the second electrode strips in the second domain have a same extension direction; and the electrode strips in the first domain and the second domain have a same extension direction.

4. The array substrate according to claim 1, wherein the first electrode strips and the second electrode strips in the first domain have a same extension direction; the first electrode strips and the second electrode strips in the second domain have a same extension direction; and the electrode strips in the first domain and the second domain have different extension directions.

5. The array substrate according to claim 4, wherein an angle between the extension direction of the electrode strips of the first domain and the extension direction of the electrode strips of the second domain is greater than 0° and less than or equal to 90°.

6. The array substrate according to claim 1, wherein the first domain further includes a part in which S1 is less than S2, and the second domain further includes a part in which S1 is greater than S2.

7. The array substrate according to claim 1, wherein the first domain and the second domain are disposed in the same subpixel; and the subpixel further includes a third domain in mirror symmetry with the first domain and a fourth domain in mirror symmetry with the second domain.

8. The array substrate according to claim 1, wherein the first domain and the second domain are disposed in different subpixels; the first domain is disposed in a first subpixel; the second domain is disposed in a second subpixel; and the array substrate further comprises a third subpixel in mirror symmetry with the first subpixel and a fourth subpixel in mirror symmetry with the second subpixel.

9. The array substrate according to claim 1, wherein in the first domain and the second domain, the area of the part in which S1 is greater than S2 is equal to the area of the part in which S1 is less than S2.

10. The array substrate according to claim 1, wherein 0.4 µm≤|S1−S2|≤0.6 µm.

11. The array substrate according to claim 1, wherein the first electrode is a common electrode, and the second electrode is a pixel electrode; or the first electrode is a pixel electrode, and the second electrode is a common electrode.

12. The array substrate according to claim 1, wherein the first electrode and the second electrode are arranged in different layers.

13. The array substrate according to claim 1, wherein the first electrode and the second electrode are arranged in a same layer.

14. The array substrate according to claim 1, wherein both the first electrode and the second electrode are transparent conductive electrodes.

15. The array substrate according to claim 1, wherein projections of the plurality of second electrode strips on the base substrate and projections of the plurality of first electrode strips on the base substrate are alternately arranged.

16. A display panel, comprising the array substrate according claim 1.

17. A display device, comprising the display panel according to claim 16.

* * * * *